US012784790B2

(12) United States Patent
Hemati et al.

(10) Patent No.: US 12,784,790 B2
(45) Date of Patent: Nov. 3, 2026

(54) WORD LINE VOLTAGE DETECTION CIRCUIT FOR ENHANCED READ OPERATION

(71) Applicant: Intel NDTM US LLC, Santa Clara, CA (US)

(72) Inventors: Saied Hemati, Granite Bay, CA (US); Binh Ngo, Folsom, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 146 days.

(21) Appl. No.: 18/047,097

(22) Filed: Oct. 17, 2022

(65) Prior Publication Data

US 2023/0079077 A1 Mar. 16, 2023

(51) Int. Cl.
*G11C 8/08* (2006.01)
*G11C 8/10* (2006.01)
*G11C 8/16* (2006.01)

(52) U.S. Cl.
CPC .................. *G11C 8/08* (2013.01); *G11C 8/10* (2013.01); *G11C 8/16* (2013.01)

(58) Field of Classification Search
CPC ................ G11C 8/16; G11C 8/10; G11C 8/08
USPC .................................................... 365/189.09
See application file for complete search history.

(56) References Cited

U.S. PATENT DOCUMENTS

2018/0189223 A1* 7/2018 Nge ...................... G06F 1/3287
2022/0172790 A1* 6/2022 Lee ........................ G11C 16/08
2023/0386524 A1* 11/2023 Chen ...................... G11C 5/145

* cited by examiner

*Primary Examiner* — Sung Il Cho
(74) *Attorney, Agent, or Firm* — Morgan, Lewis & Bockius LLP

(57) ABSTRACT

Technology herein provides a performance-enhanced memory device including a memory array including a local word line circuit and a plurality of local word lines coupled to the local word line circuit, a word line (WL) sense circuit coupled to an access node in the local word line circuit, the WL sense circuit to sense a voltage level in the local word line circuit while bypassing a disturbance to operation of the local word lines and to provide an output signal that indicates when the voltage level has reached a high voltage threshold value to enable a read operation. The technology also provides read logic coupled to the WL sense circuit, the read logic to receive the output signal from the WL sense circuit, and trigger a read operation for one or more cells in the memory array when the output signal indicates that the voltage level has reached the high voltage threshold value.

19 Claims, 5 Drawing Sheets

WORD LINE VOLTAGE DETECTION CIRCUIT FOR ENHANCED READ OPERATION

TECHNICAL FIELD

Embodiments generally relate to memory devices. More particularly, embodiments relate to a word line detection circuit and placement to provide enhanced read operations in a memory device.

BACKGROUND

Memory devices, such as three-dimensional (3D) NAND memory devices, use word lines for selecting which memory cell(s) are activated for read (and other) operations. Before a read operation is triggered (e.g., by read logic), the appropriate activating word line(s) must reach a high voltage threshold—e.g., target voltage sufficient for the read operation to be successful. The read logic has to estimate when the word line voltage has reached the high voltage threshold before triggering a read operation. This estimation can differ depending on whether the memory device is operating in VPP mode or non-VPP mode. In VPP mode, an external or off-chip high voltage DC power source, often denoted as VPP, is available. VPP is typically in the range of about 12V DC. In non-VPP mode, there is no external or off-chip high voltage power source (or if available it is not used, rather the device is powered by a low voltage source, typically in the range of 3.6V DC or less. Any high voltages needed in non-VPP mode are created on-chip.

Current estimating solutions rely on an open loop timer for VPP mode, or on measurements of a voltage regulator output for non-VPP mode, to estimate when the word line has reached the high voltage threshold. However, these solutions each have substantial disadvantages. For example, the open loop timer must be set for the worst case scenario—i.e., the maximum possible time that the word line voltage takes to ramp up to the high voltage threshold. This worst case typically occurs at the first read after being idle for a period of time; for subsequent reads the word line voltage actually ramps up a few μs faster. Thus, reliance on an open loop timer causes delays in most read operations when the timer exceeds the actual ramp-up time. As another example, when measuring the voltage regulator output there is a lag between the voltage regulator output and the word line voltage in non-VPP mode (an even greater lag occurs in VPP mode) which results in less-than-accurate estimation of when the word line has reached the high voltage threshold. Current or prior solutions have not attempted to measure voltages closer to the local word lines because the sensing circuits disturb operation of the word lines, rendering any such sensing efforts non-feasible.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

A performance-enhanced memory device as described herein provides a word line (WL) sense circuit coupled to an access node (or access point) in a local word line circuit (e.g., at an intermediate point between a global word line circuit and the local word lines connected to memory cells). The WL sense circuit senses a voltage level in the local word line circuit while bypassing a disturbance to operation of the local word lines and provides an output signal that indicates when the voltage level has reached a high voltage threshold value to enable a read operation (e.g., the high voltage threshold is set to at least a level sufficient to support read operations). For example, the WL sense circuit compares the input sensed via the access node with a reference voltage and outputs a bit to indicate the input signal has exceeded a high voltage threshold that is set using a low voltage reference. The output bit is used by read logic (e.g., in on-chip firmware) to trigger read operations. The WL sense circuit draws no DC current or at most a level of current that is merely due to secondary effects such as oxide intrinsic leakage current. Such leakage currents are less than a pA (pico-amp)—an amount of current below a value that would cause change in word line voltage and time response and, thus, does not disturb operation of the local word lines.

The technology provides a closed-loop solution that helps improve the overall performance of memory devices in both VPP mode and non-VPP mode by speeding up the detection of when the word line voltage has reached a level to support read operations (e.g., at least a level sufficient to support read operations), as well as providing a more accurate detection, and thus enables expedited read operations by the memory devices. This enables read operations to be shortened by a few μs per read in VPP mode. In non-VPP mode, the speed-up can vary based on 3D NAND design, but would typically be at least a fraction of a μs per read. As the read operation is the most common operation in memory devices (e.g., NAND memory devices), the throughput of memory devices is significantly boosted. Moreover, eliminating the extra idle time reduces the consumed power due to leakage and improves energy efficiency of the memory devices.

Figure 1A:
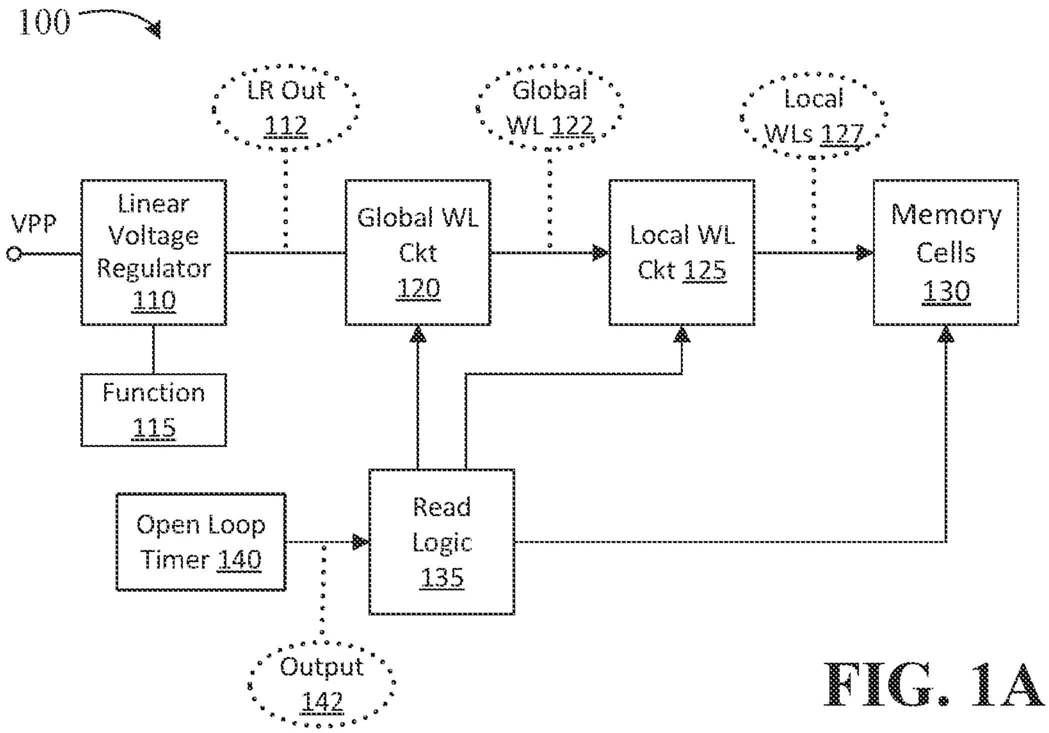
FIG. 1A provides a block diagram illustrating a read configuration for a conventional memory device.

FIG. 1A provides a block diagram illustrating a read configuration for a conventional memory device 100 (e.g., a NAND memory device). The conventional memory device 100 includes a linear voltage regulator 110 having a linear voltage regulator output 112 which is coupled to a global word line circuit 120. The linear voltage regulator 110 is, in some devices, coupled to an external high voltage signal, VPP, which is approximately 12V DC. Where the external VPP input is not available, the memory device has to generate the high voltage on-chip using the available low voltage supply (typically less than 4V DC). The linear voltage regulator 110 provides the linear voltage regulator output 112 based on function 115 (e.g., a read, write, or erase function), such as provided via firmware.

The global word line circuit 120 can include, e.g., one or more high voltage switches and one or more global word line drivers to drive a selected voltage onto a global word line 122. The global word line 122 can be selectively coupled to multiple word lines 127 via the local word line circuit 125. The local word lines 127 are coupled to memory cells 130. Read logic 135 controls the operation and timing of the global word line circuit 120, the local word line circuit 125 and the memory cells 130 to perform read operations (e.g., reading data stored as voltages in the selected memory cells).

For VPP mode operation—that is, when the external high voltage VPP input is present, the conventional memory device 100 uses an open loop timer 140 to estimate when the word line voltage(s) have reached high voltage threshold value to enable a read operation (e.g., at least a level sufficient to support read operations). The timer has a logic output 142 (e.g., a logic "1") that indicates when the estimated high voltage threshold has been reached. The timer is set such that the logic output provides such an indication only after the maximum possible ramp-up time has elapsed, so that in most read operations the timer causes an unnecessary delay in triggering read operations. For non-VPP mode operation, the conventional memory device 100 measures (not shown in FIG. 1A) the linear voltage regulator output and uses that to estimate when the when the word line voltage(s) have reached a high voltage threshold value (e.g., at least a level sufficient to support read operations). Because there is a lag there between the voltage regulator output and the word line, this results in less-than-accurate estimation of when the word line has reached the high voltage threshold, which in turn results in unnecessary delay in triggering read operations.

Figure 1B:
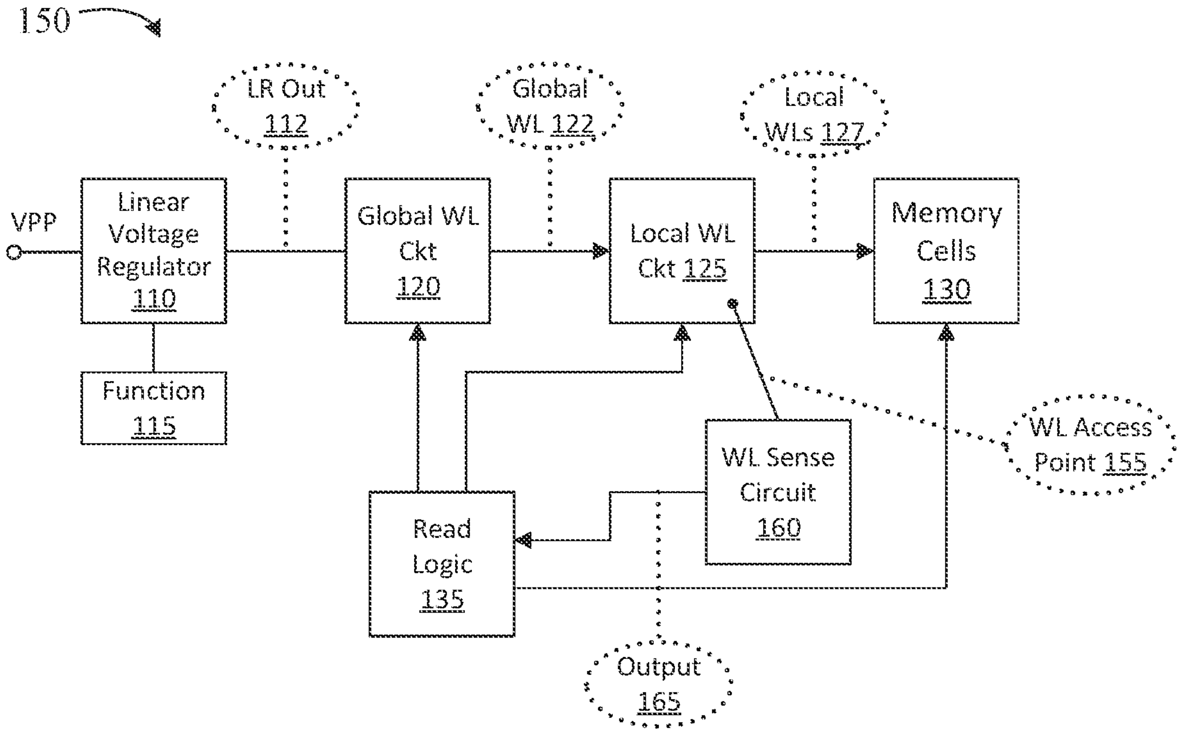
FIG. 1B provides a block diagram illustrating a read configuration for an example of a performance-enhanced memory device according to one or more embodiments.

FIG. 1B provides a block diagram illustrating a read configuration for an example of a performance-enhanced memory device 150 (e.g., a NAND memory device) according to one or more embodiments, with reference to components and features described herein including but not limited to the figures and associated description. FIG. 1B illustrates many of the same components and aspects as described with reference to the conventional memory device 100 (FIG. 1A), but with several key changes. Description of components common to FIG. 1A and FIG. 1B will not be repeated except as necessary to describe the improvements. As shown in FIG. 1B, the enhanced memory device 150 includes a word line (WL) sense circuit 160 that is coupled to an access node in the local word line circuit 125. Coupling to an access node in the local word line circuit 125 provides voltage sensing at an intermediate point between the global word line circuit 120 and the local word lines 127 that are coupled to the memory cells 130.

The WL sense circuit 160 is configured to draw no DC current from the access node in the local word line circuit, or to draw a level of current that is less than a value that disturbs operation of the local word lines. The WL sense circuit draws no DC current or at most a level of current that is merely due to secondary effects such as oxide intrinsic leakage current. Such leakage currents are less than a pA (pico-amp), an amount of current below a value that would cause change in word line voltage and time response and, thus, such leakage does not disturb operation of the local word lines. The WL sense circuit 160 provides an output 165 (e.g., a logic output signal) that indicates when the voltage level of the word lines (e.g., the local word lines 127) has reached a high voltage threshold value (e.g., at least a level sufficient to support read operations).

Because the access node in the local word line circuit 125 is much closer to the local word lines 127 than the linear voltage regulator output 112, the voltage sensed by the WL sense circuit 160 is very close to the actual voltage on the local word lines 127, with low lag. Accordingly, the WL sense circuit 160 can accurately and consistently provide the indication to the read logic 135 that the voltage on the local word lines has reached a high voltage threshold (e.g., at least a level sufficiently high to support a read operation). In this way, the read logic can trigger the read operations more quickly, resulting in more read operations per unit time, without the need to adjust or modify timing to account for a coarseness in estimation that occurs, e.g., when sensing the liner voltage regulator output. The WL sense circuit operates in both VPP mode and non-VPP mode. The enhanced memory device 150 thus eliminates (or bypasses use of) the open loop timer 140 used for VPP mode (FIG. 1A, already discussed), and likewise eliminates (or bypasses) measuring the linear voltage regulator output for non-VPP mode.

Some or all components or features of the memory device 150 (including, e.g., read logic 135) can be implemented using a field programmable gate array (FPGA), an application specific integrated circuit (ASIC), other hardware logic (e.g., logic circuitry), via a controller with software or firmware, and/or in a combination of a controller with software/firmware and logic, an FPGA or ASIC. More particularly, components of the memory device 150 can be implemented in one or more modules as a set of program or logic instructions stored in a machine- or computer-readable storage medium such as random access memory (RAM), read only memory (ROM), programmable ROM (PROM), firmware, flash memory, etc., in hardware, or any combination thereof. For example, hardware implementations can include configurable logic, fixed-functionality logic, or any combination thereof. Examples of configurable logic include suitably configured programmable logic arrays (PLAs), FPGAs, complex programmable logic devices (CPLDs), and general purpose microprocessors. Examples of fixed-functionality logic include suitably configured ASICs, combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

Figure 2:
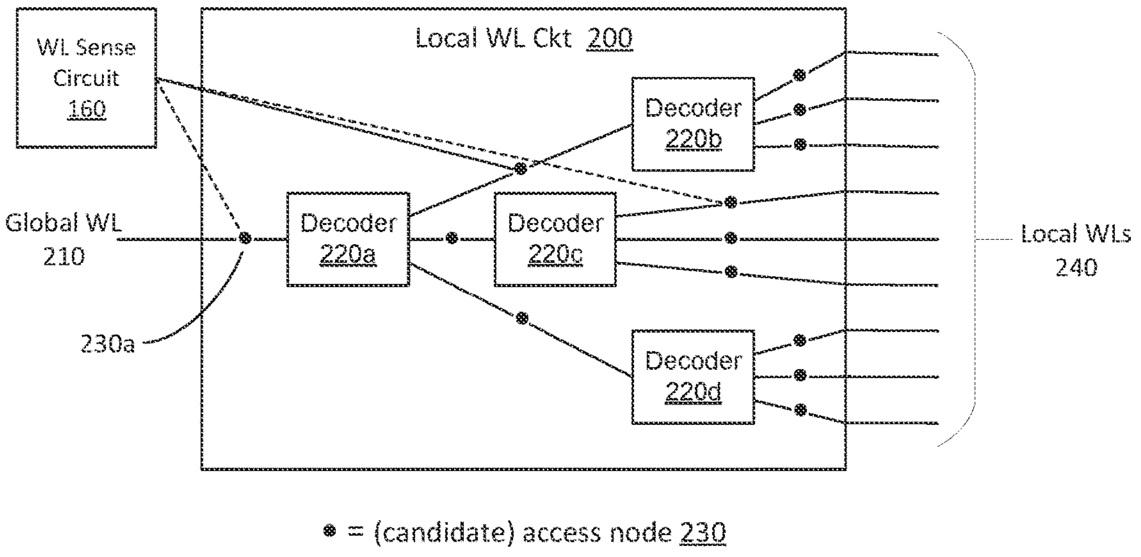
FIG. 2 provides a block diagram illustrating aspects of an example of a local word line circuit according to one or more embodiments.

FIG. 2 provides a block diagram illustrating aspects of an example of a local word line circuit 200 according to one or more embodiments, with reference to components and features described herein including but not limited to the figures and associated description. The local word line circuit 200 is implemented as part of a memory device, such as the memory device 150 (FIG. 1B, already discussed). In embodiments, the local word line circuit 200 corresponds to the local word line circuit 125 (FIG. 1B, already discussed). The the local word line circuit 200 is coupled to a global word line 210 (e.g., corresponding to the global word line 122 in FIGS. 1A-1B) and is configured to divide the global word line into branches via one or more decoders 220 (e.g., decoders 220*a*, 220*b*, 220*c* and/or 220*d*) resulting in signals output to local word lines 240 (e.g., corresponding to the local word lines 127 in FIGS. 1A-1B). The decoders operate based on logic control signals, e.g. from the read logic 135 (not shown in FIG. 2) to switch word line signals to the appropriate local word lines based on the target address.

A WL sense circuit such as, e.g., the WL sense circuit 160 (FIG. 1B, already discussed) is coupled to one or more access nodes 230 (illustrated as dots in FIG. 2) within the local word line circuit 200. The WL sense circuit senses the voltage at the access node, while bypassing a disturbance to operation of the local word lines 240, to provide a logic output indicating when the word line voltage has reached a high voltage threshold to support read operations (e.g., at least a level sufficient to support read operations). Because word lines (e.g., local word lines 240) have high impedance, drawing any load current from any access nodes, as high-impedance nodes, would disturb the word lines by changing the voltage and time response and, thus, invalidate any attempted voltage detection. Accordingly, the WL sense circuit 160 is designed such that the circuit bypasses a disturbance to operation of the local word lines by drawing no DC current from the access node (or at most a de-minimis amount of current is drawn, not enough to cause change in word line voltage and time response). Further details regarding the WL sense circuit are provided herein with reference to FIG. 4.

As shown in the example of FIG. 2, there are a number of candidate access nodes 230 to which the WL sense circuit 160 can be coupled. For example, an access node 230 can be located between the global word line 210 and the decoder 220*a*. As another example, an access node 230 can be located between the decoder 220*a* and the decoder 220*b*, between the decoder 220*a* and the decoder 220*c*, and/or between the decoder 220*a* and the decoder 220*d*. As another example, an access node 230 can be located between the decoder 220*b* and respective outputs to the local word lines 240, between the decoder 220*c* and respective outputs to the local word lines 240, and/or between the decoder 220*d* and respective outputs to the local word lines 240. In embodiments, selection of appropriate access node(s) 230 is determined based on the architecture of the particular memory device. For example, in embodiments access nodes are selected based on location of routing lines, etc. within the local word line circuit 200. For example, in embodiments access nodes are selected based on location of routing lines, etc. in a manner such that the routing lines within the local word line circuit 200 are not moved or otherwise modified. In some embodiments, access nodes are selected based on one or more additional or other factors, such as, e.g., providing reduced interference with high voltage noisy signals, better routing, lower layout overhead, reduced parasitic current or voltage, word line decoder, etc.

Figure 3A:
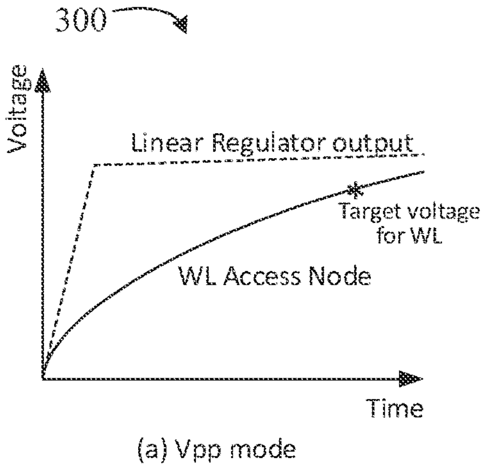
FIGS. 3A and 3B provide diagrams illustrating examples of voltage ramp-up in a memory device according to one or more embodiments.
Figure 3B:
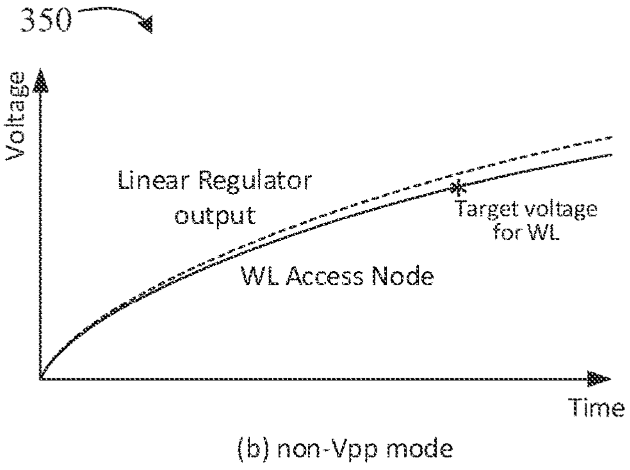

FIGS. 3A and 3B provide diagrams illustrating examples of voltage ramp-up in a memory device according to one or more embodiments, with reference to components and features described herein including but not limited to the figures and associated description. Each diagram illustrates voltages at the linear regulator output (e.g., the linear voltage regulator output 112 in FIGS. 1A-1B, already discussed) and an access node (e.g., an access node 230 in the local word line circuit 200 in FIG. 2, already discussed). For each diagram, the horizontal distance between the two curves (regulator output voltage and access node voltage) shows the ramp-up timing difference, which leads to estimation error when attempting to rely on the regulator output.

In FIG. 3A, a diagram 300 illustrates voltage ramp-up for VPP mode read operation (i.e., when an external high-voltage, VPP, is applied). The diagram 300 shows the ramp-up of the linear regulator output voltage and the voltage ramp-up at an access node in a local word line circuit. In VPP mode, the linear regulator output voltage (shown in FIG. 3A as a dotted line) quickly settles at its final value (due, at least in part, to low VPP-supply-internal-resistance, as an off-chip high-voltage supply, in VPP mode). Meanwhile, the voltage at the word line access node (shown in FIG. 3A with a solid line) ramps up more slowly than the linear regulator output voltage, finally reaching a high voltage threshold value (e.g., target voltage, at a point marked by "*") sufficient to support read operations. Because there is such a large difference in ramp-up time between voltages at the linear regulator output and the word line access node, measurements of the linear regulator output cannot support even a coarse estimate of when the target voltage is reached at the word line(s). Measuring voltage at the word line access node enables direct (or near-direct) measurement of the actual word line voltage and, thus, an exact or very close estimate of when the word line voltage has reached the target voltage.

In FIG. 3B, a diagram 350 illustrates voltage ramp-up for non-VPP mode read operation (i.e., when an external high-voltage, VPP, is not available or not used; an internally-generated high voltage is used instead). The diagram 350 shows the ramp-up of the linear regulator output voltage and the voltage ramp-up at an access node in a local word line circuit (e.g., an access node 230 in the local word line circuit 200 in FIG. 2, already discussed). The ramp-up in voltage at the word line access node (shown in FIG. 3B with a solid line) to reach the target voltage (at a point marked by "*") is similar to the ramp-up in voltage at the word line access node for VPP mode as illustrated in FIG. 3A. In non-VPP mode, the linear regulator output voltage (shown in FIG. 3B as a dotted line) ramps up more slowly than in VPP mode (as shown in FIG. 3A), and thus more closely approximates the voltage ramp-up for the word line access node. Nevertheless, there is still a difference (e.g., lag—the horizontal distance between the curves that creates the timing error, which is not necessarily small even in non-VPP mode) in ramp-up time between voltages at the linear regulator output and the word line access node, such that measurements of the linear regulator output can only support at best a coarse estimate of when the target voltage is reached at the word line(s). Thus, attempts to rely on regulator output measurements results in unnecessary delays in read operations. As with VPP mode, in non-VPP mode measuring voltage at the word line access node enables direct (or near-direct) measurement of the actual word line voltage and, thus, an exact or very close estimate of when the word line voltage has reached the target voltage.

Figure 4:
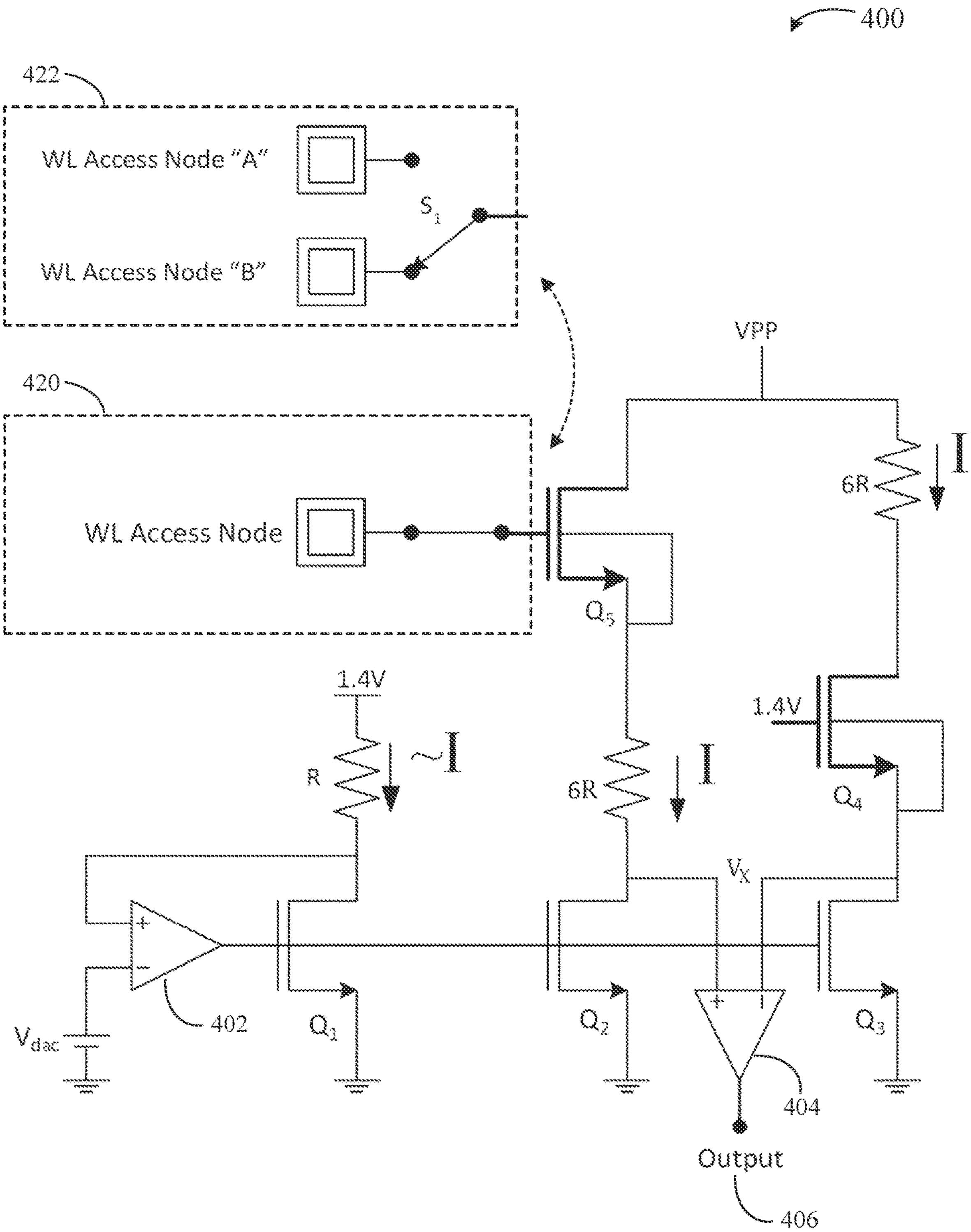
FIG. 4 provides a circuit diagram for an example word line (WL) sense circuit according to one or more embodiments.

FIG. 4 provides a circuit diagram for an example word line (WL) sense circuit 400 according to one or more embodiments, with reference to components and features described herein including but not limited to the figures and associated description. In embodiments, the WL sense circuit 400 corresponds to the WL sense circuit 160 (FIG. 1B, already discussed). Although the example WL sense circuit 400 includes a number of components arranged as illustrated in FIG. 4, it will be understood that other circuit arrangements with the same or different components (and/or components with different values) can be used that provide the same or similar characteristics as those in the circuit 400. In VPP-mode operation, the WL sense circuit 400 receives a high voltage input, VPP, which is provided by the external or off-chip high voltage. In non-VPP mode operation, an internally generated (on-chip) high voltage signal is used instead of VPP. The WL sense circuit 400 provides a high voltage comparator equivalent that is controlled by a low voltage reference ($V_{dac}$). The WL sense circuit 400 includes a differential pair of minimum-sized high voltage transistors, $Q_4$ and $Q_5$, that is intentionally imbalanced by design.

The transistor $Q_5$ presents a high impedance at its gate, and presents little added capacitive loading and draws no DC current beyond the intrinsic gate oxide leakage current (which is less than a pA)—an amount of current below a value that would cause change in word line voltage and time response and, thus, such leakage would not disturb operation of the local word lines. The gate of the transistor $Q_5$ is coupled to the sensed input signal from a high-voltage hi-impedance node word line access node (such as a word line access node 230 in FIG. 2, already discussed). Because of the high gate impedance, the gate of the transistor $Q_5$ draws no DC current from the word line access node (or an amount of current below a value that disturbs operation of the word lines) so as to not load the input signal.

Thus, by drawing no DC current (or an amount of current below a value that would cause change in word line voltage and time response) the WL sense circuit 400 senses voltage at the WL sense node while bypassing a disturbance to operation of the local word lines during a read operation. The gate of the other transistor ($Q_4$) of the differential pair is connected to a low voltage reference voltage (for example, 1.4V as shown in FIG. 4). Transistors $Q_1$, $Q_2$, and $Q_3$ are of identical size, with the gate of each of these transistors connected in common to a comparator 402 having the low voltage reference, $V_{dac}$, as one of the inputs.

In operation, the WL sense circuit 400 compares the voltage of the input signal from the word line access node, which ramps up for a read operation, with a pre-determined high voltage reference ($V_{ref\_high}$) that is generated within the circuit based on the low voltage reference, $V_{dac}$. The WL sense circuit 400 detects when the input signal voltage at the input node (i.e., the sensed voltage from the from the word line access node) exceeds the reference voltage and the output 406 flips high (e.g., logic "1") when the voltage at the word line access node has reached a high voltage threshold (e.g., at least a level sufficient to support read operations). This, in turn, signals the read logic to trigger a read operation.

For example, a low voltage comparator 404 outputs a low voltage high signal (corresponding to digital bit 1) at the output terminal 406 when $V_X$ is a positive voltage signal—indicating the sensed word line voltage has reached the target (e.g., high voltage threshold). In embodiments the output terminal 406 corresponds to the output 165 (FIG. 1B, already discussed) and is coupled to the read logic 135 (FIG. 1B).

$V_X$ is a differential voltage measured between the left and right legs of the imbalanced differential pair circuit and indicates if the two legs are balanced. When $V_X$=0V, the legs of the imbalanced differential pair are balanced and all terminals of the transistors $Q_2$ and $Q_3$ have identical voltages, therefore, regardless of regions of operation for $Q_2$ and $Q_3$, these two transistors have identical drain currents (shown as current I in FIG. 4). Meanwhile, the transistors $Q_4$ and $Q_5$ have identical drain currents and identical $V_{DS}$ voltages, due to an equal voltage drop across identical resistors conducting equal currents, and have no body effect. Thus, the gate-source voltages are the same for these transistors:

$$V_{gsQ_5} = V_{gsQ_4} \qquad \text{EQ. (1)}$$

Therefore, $V_{ref\_high}$—the high voltage threshold of the circuit, is:

$$V_{ref\_high} = V_{gsQ_5} + 6RI + V_{sgQ_4} + 1.4 \qquad \text{EQ. (2)}$$

Based on EQ. (1), $V_{gsQ_5}$=$-V_{sgQ_4}$, thus:

$$V_{ref\_high} = 6RI + 1.4 \qquad \text{EQ. (3)}$$

Ideally, $Q_1$ has the same drain current as $Q_2$ (although this condition is not guaranteed, transistors $Q_1$, $Q_2$, and $Q_3$ can be selected/sized appropriately to make their currents as close as desired or alternatively, the $V_{dac}$ low voltage reference can be trimmed to the target value). Thus:

$$I \approx \frac{1.4 - V_{dac}}{R} \qquad \text{EQ. (4)}$$

Substituting I from EQ. (4) into EQ. (3) yields:

$$V_{ref\_high} \approx 6(1.4 - V_{dac}) + 1.4 = 9.8 - 6V_{dac} \qquad \text{EQ. (5)}$$

According to EQ. (5), $V_{ref\_high}$ is controlled linearly by the low voltage reference $V_{dac}$. For example, if $V_{dac}$ is 0.5V, $V_{ref\_high}$ is 6.8V. Simulation results show the derived equation is closely followed in the circuit in different transistor corners and temperatures when the ramping rate is 0.4V/μs. When the ramping rate increases to 4V/μs, the threshold voltage is shifted up by 0.2V. A 0.2V shift in the high voltage threshold at a 4V/μs ramp means a shift of about 50 ns in timing. This shift can be determined, e.g., in silicon testing where characterization of a specific memory device would yield an optimal threshold setting (e.g., via $V_{dac}$).

In embodiments, the low voltage reference $V_{dac}$ can be optimized (e.g., adjusted or tuned) based on operating conditions such as, e.g., device temperature. For example, to achieve the highest level of accuracy, the low voltage reference $V_{dac}$ can be empirically fine-tuned in a closed-loop test set-up to achieve the most desirable outcome for any working condition including the temperature, voltage, and loading variations. Examples of tuning factors include working temperature, VPP voltage variations, loading and algorithm choices such as single plane or multiple planes read with different ramp-up rates.

As mentioned above and as shown in FIG. 4, in embodiments the gate of the transistor $Q_5$ is coupled to the WL access node 230 in the local WL circuit 200 (see block 420 in FIG. 4). As an alternative, in some embodiments the gate of the transistor $Q_5$ is coupled through a switch S1 to two (or more) access nodes 230, such as access node "A" or access node "B", in the local WL circuit 200 (see block 422 in FIG. 4, which can be substituted for block 420). Alternatively, a multiplexer can be used in place of the switch $S_1$. Engaging the switch S1 enables the WL sense circuit to be selectively coupled to different access nodes in the local word line circuit, depending on circuit characteristics, operating conditions, etc. Providing a plurality of access points also enables the ability to observe the voltage ramp-up in different locations along the WL route and gives the designer a better chance to design, study, and optimize the read operation and/or other related algorithms and find the best location to place an access point.

In some embodiments, a global WL can be a default access node (e.g., access node 230*a* in FIG. 2). For example, the memory device would have one such access point for each set of global WL (e.g., one per plane—thus, if the device has four planes, it will have four sets of global WLs, and hence 4 global WL access points. The specific global WL used as an access point (i.e. gwl[50] out of 200 global WLs) is location dependent for ease of routing. Local WL access node(s) (e.g., one or more other access nodes 230 in FIG. 2) can, in embodiments, be used for special dedicated blocks such as OTP (one-time program), rom blocks (2nd storage), and Si characterization.

Figure 5:
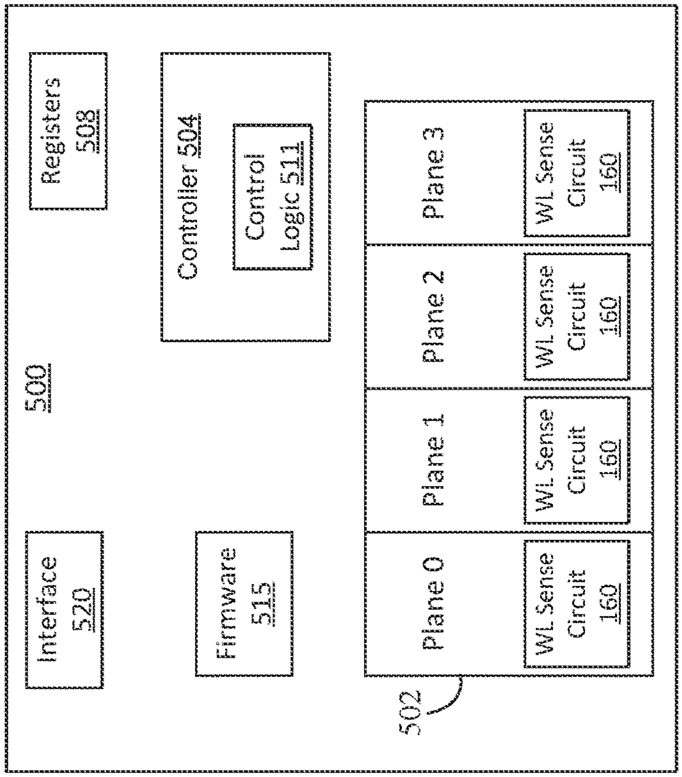
FIG. 5 provides a block diagram for an example memory device according to one or more embodiments.

FIG. 5 provides a block diagram for an example memory device 500 according to one or more embodiments, with reference to components and features described herein including but not limited to the figures and associated description. The memory device includes a memory medium 502 for storing data. The memory medium 502 can be a memory or storage medium that can store one or more bits in memory cells. For example, the memory medium 502 can include non-volatile and/or volatile types of memory. In one example, the memory medium 502 includes one or more non-volatile memory die, each divided into multiple planes or groups. In some examples, the memory medium 502 can include block addressable memory devices, such as NAND technologies. In one example, the memory medium 502 includes a NAND flash memory array such as, e.g., three-dimensional (3D) NAND memory. The memory medium 502 can also include non-volatile types of memory, such as 3D crosspoint memory (3D×P), or other byte addressable non-volatile memory. Other technologies, such as some NOR flash memory, may be byte addressable for reads and/or writes, and block addressable for erases. The memory medium 502 can include a single-level cell (SLC) NAND storage device, a multi-level cell (MLC) NAND storage device, triple-level cell (TLC) NAND storage device, quad-level cell (QLC) storage device, penta-level cell (PLC) storage device, or a device with higher-levels cells.

The memory device 500 can communicate with a computing platform (e.g., a processor, host system, etc., not shown in FIG. 5) via an interface 520. For example, in some embodiments the memory device 500 communicates via the interface 520 with a memory controller integrated within the computing platform (e.g., a memory controller integrated within a processor). In one example, the interface 520 is compliant with a standard such as PCI Express (PCIe), serial advanced technology attachment (ATA), a parallel ATA, universal serial bus (USB), and/or other interface protocol.

The memory device 500 includes a controller 504. The controller 504 can communicate with elements of the computing platform (e.g., via the interface 520) to read data from memory medium 502 or write data to memory medium 502. For example, in embodiments the controller 504 is configured to receive requests from the computing platform and generate and perform commands concerning the use of memory medium 502 (e.g., to read data, write, or erase data). Other commands may include, for example, commands to read status, commands to change configuration settings, a reset command, etc. The controller 504 includes control logic 511 for carrying out some or all of the functions of the controller 504. In embodiments the memory device 500 includes firmware 515 coupled to and executed by the controller 504. Although the firmware 515 is illustrated as being separate from the controller 504, in embodiments the firmware 515 is stored in or otherwise integrated within the controller 504 and/or the control logic 511. In embodiments, the read logic 135 (FIG. 1B) corresponds to a portion of the control logic 511 and/or firmware 515. In embodiments, the controller 504 (via control logic 511) and/or firmware 515 carry out or perform operations of the read logic 135 (FIG. 1B, already discussed).

Some or all components or features of the memory device 500 (including, e.g., the controller 504 and/or the control logic 511) can be implemented using a field programmable gate array (FPGA), an application specific integrated circuit (ASIC), other hardware logic (e.g., logic circuitry), via a controller with software or firmware, and/or in a combination of a controller with software/firmware and logic, an FPGA or ASIC. More particularly, components of the memory device 500 can be implemented in one or more modules as a set of program or logic instructions stored in a machine- or computer-readable storage medium such as random access memory (RAM), read only memory (ROM), programmable ROM (PROM), firmware, flash memory, etc., in hardware, or any combination thereof. For example, hardware implementations can include configurable logic, fixed-functionality logic, or any combination thereof. Examples of configurable logic include suitably configured programmable logic arrays (PLAs), FPGAs, complex programmable logic devices (CPLDs), and general purpose microprocessors. Examples of fixed-functionality logic include suitably configured ASICs, combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

The controller 504 is coupled with the memory medium 502 to control or command the memory device 500 to cause operations to occur (e.g., read, program, erase, suspend, resume, and other operations). Communication between the memory medium 502 and the controller 504 can include writing to and/or reading from specific registers (e.g., registers 508). Such registers may reside in the controller 504, in the memory medium 502, or external to the controller 504 and the memory medium 502.

In embodiments the controller 504 is coupled to word lines of memory medium 502 to select one of the word lines, apply read voltages, apply program voltages combined with bit line potential levels, or apply erase voltages. In embodiments the controller 504 is also coupled to bit lines of memory medium 502 to read data stored in the memory cells, determine a state of the memory cells during a program operation, and control potential levels of the bit lines to promote or inhibit programming and erasing. Other circuitry can be used for applying selected read voltages and other signals to memory medium 502.

In embodiments the memory medium 502 includes 3D NAND memory, where the memory device 500 has multiple planes per die—such as, e.g., Plane 0, Plane 1, Plane 2, Plane 3, etc. as illustrated in FIG. 5. A plane includes multiple memory cells which may be grouped into blocks. A block is typically the smallest erasable entity in a NAND flash die. In one example, a block includes a number of cells that are coupled to the same bit line. A block includes one or multiple pages of cells. The size of the page can vary depending on implementation. In one example, a page has a size of 16 kB. Page sizes of less or more than 16 kB are also possible (e.g., 512 B, 2 kB, 4 kB, etc.). Each plane also includes a local word line circuit and local word lines coupled to the memory cells in the plane.

In multi-place configurations, the memory device 500 can receive multiple commands, each to access one of the planes. Independent multi-plane operations enable independent and concurrent operations per plane. Separate state machines for each plane enable application of different bias voltages for each plane to independently and concurrently service requests. Accordingly, in embodiments as illustrated in FIG. 5 each plane has at least one WL sense circuit 160, each WL sense circuit 160 configured as described herein with reference to FIG. 1B and FIG. 2 and coupled to an access node in a local word line circuit in the respective plane.

Figure 6:
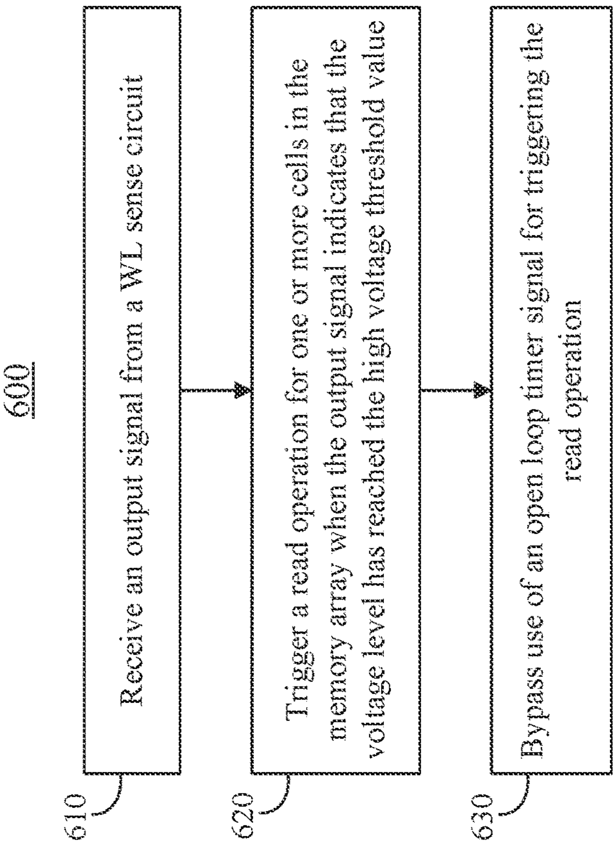
FIG. 6 provides a flow chart illustrating an example method of controlling a memory read operation according to one or more embodiments.

FIG. 6 provides a flow chart illustrating an example method 600 of controlling a memory read operation according to one or more embodiments, with reference to components and features described herein including but not limited to the figures and associated description. The method 600 can generally be implemented in the read logic 135 (FIG. 1B, already discussed) and/or via components of the memory device 500 (such as, e.g., via the control logic 511 or the firmware 515 in FIG. 5, already discussed). More particularly, the method 600 can be implemented using a field programmable gate array (FPGA), an application specific integrated circuit (ASIC), other hardware logic (e.g., logic circuitry), via a controller with software or firmware, and/or in a combination of a controller with software/firmware and logic, an FPGA or ASIC. Further, components of the memory device 150 can be implemented in one or more modules as a set of program or logic instructions stored in a machine- or computer-readable storage medium such as random access memory (RAM), read only memory (ROM), programmable ROM (PROM), firmware, flash memory, etc., in hardware, or any combination thereof. For example, hardware implementations can include configurable logic, fixed-functionality logic, or any combination thereof. Examples of configurable logic include suitably configured programmable logic arrays (PLAs), FPGAs, complex programmable logic devices (CPLDs), and general purpose microprocessors. Examples of fixed-functionality logic include suitably configured ASICs, combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

Illustrated processing block 610 provides for receiving an output signal (such as, e.g., the output signal 165 in FIG. 1B) from a WL sense circuit (such as, e.g., the WL sense circuit 160 in FIG. 1B). The WL sense circuit is coupled to an access node in a local word line circuit in a memory array, the sense circuit to sense a voltage level in the local word line circuit while bypassing a disturbance to operation of the local word lines. Illustrated processing block 620 provides for triggering a read operation for one or more cells in the memory array (such as, e.g., the memory cells 130) when the output signal indicates that the voltage level has reached a high voltage threshold value to enable a read operation. The high voltage threshold value is, e.g., a target voltage sufficient for a read operation to be successful. In some embodiments, illustrated processing block 630 provides for bypassing use of an open loop timer signal for triggering the read operation.

Figure 7:
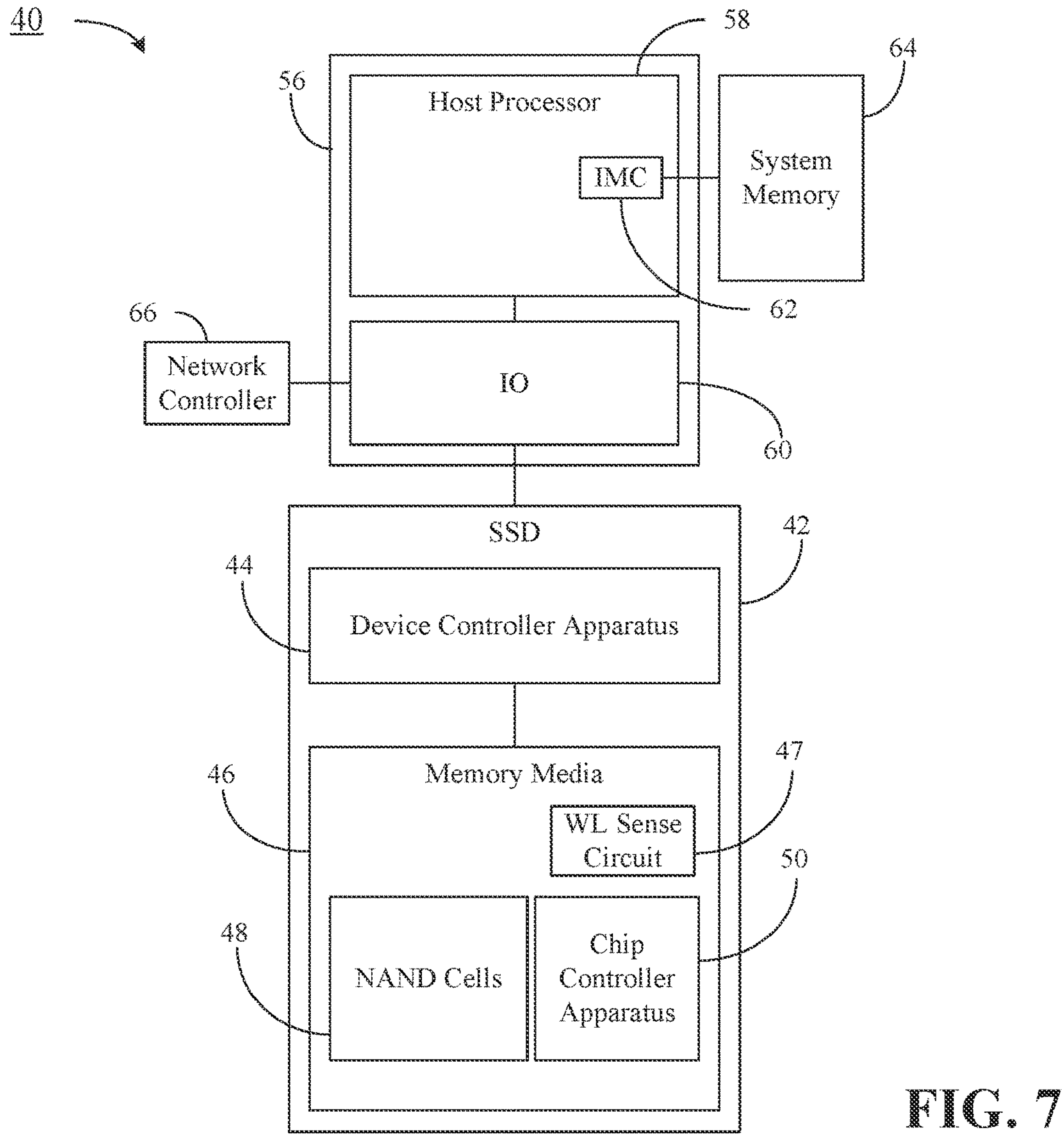
FIG. 7 is a block diagram of an example of a performance-enhanced computing system according to one or more embodiments.

FIG. 7 is a block diagram of an example of a performance-enhanced computing system 40 according to one or more embodiments, with reference to components and features described herein including but not limited to the figures and associated description. The system 40 can be part of a server (e.g., a cloud server), desktop computer, notebook computer, tablet computer, convertible tablet, smart television (TV), personal digital assistant (PDA), mobile Internet device (MID), smart phone, wearable device, media player, vehicle, robot, Internet of Things (IoT) device, drone, autonomous vehicle, etc., or any combination thereof. In the illustrated example, an input/output (IO) module 60 is communicatively coupled to a solid state drive (SSD) 42 and a network controller 66 (e.g., wired, wireless).

The system 40 can also include a host processor 58 (e.g., central processing unit/CPU) that includes an integrated memory controller (IMC) 62, wherein the illustrated IMC 62 communicates with a system memory 64 (e.g., DRAM) over a bus or other suitable communication interface. In embodiments the host processor 58 and the IO module 60 are integrated onto a shared semiconductor die 56 in a system on chip (SoC) architecture. In embodiments the system 40 also includes a high voltage power supply (not shown in FIG. 7).

In embodiments the SSD 42 includes a device controller apparatus 44 coupled to memory media 46 (e.g., non-volatile memory (NVM) media). In some embodiments, the memory media 46 includes a chip controller apparatus 50 coupled to a plurality of NAND cells 48. In embodiments, the device controller apparatus 44 and/or the chip controller apparatus 50 includes logic to perform operations by the read logic 135 (FIG. 1B), the control logic 511 (FIG. 5) and/or the firmware 515 (FIG. 5), including operations of the method 600 (FIG. 6). In embodiments the SSD 42 includes or corresponds to the performance-enhanced memory device 150 (FIG. 1B).

Thus, in embodiments, the memory media 46 in the SSD 42 includes a WL sense circuit 47 that is coupled to a WL access node in a local WL circuit (not shown in FIG. 7). The WL sense circuit 47 is configured to provide an output (e.g., a logic output signal such as the output 165 in FIG. 1B) that indicates when the voltage level of the word lines has reached a high voltage threshold value (e.g., target voltage sufficient to enable a read operation). In embodiments, the WL sense circuit 47 corresponds to the WL sense circuit 160 (FIG. 1B). The computing system 40 is therefore performance-enhanced at least to the extent that read operations are performed by using a closed-loop solution that determines when the word line(s) have reached the target voltage, without relying on an open loop solution or a solution that measures a voltage regulator output. The memory arrangement of the SSD 42 (including WL sense circuit and controller) thus enables expedited read operations by the memory device. The result is a substantial improvement in the throughput of memory devices, as well as reduced power consumed and improved energy efficiency.

Figure 8:
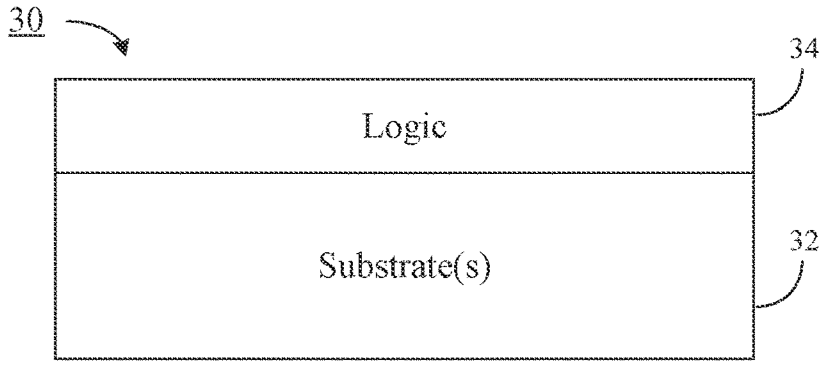
FIG. 8 is a block diagram illustrating an example semiconductor apparatus according to one or more embodiments.

FIG. 8 is a block diagram illustrating an example semiconductor apparatus 30 according to one or more embodiments, with reference to components and features described herein including but not limited to the figures and associated description. The semiconductor apparatus 30 can be implemented, e.g., as a chip, die, or other semiconductor package. The semiconductor apparatus 30 can include one or more substrates 32 comprised of, e.g., silicon, sapphire, gallium arsenide, etc. The semiconductor apparatus 30 can also include logic 34 comprised of, e.g., transistor array(s) and other integrated circuit (IC) components) coupled to the substrate(s) 32. The logic 34 can be implemented at least partly in configurable logic or fixed-functionality logic hardware. The logic 34 can implement the system on chip (SoC) 56 and/or the SSD 42 described above with reference to FIG. 7. The logic 34 can implement one or more aspects of the processes described above, including the method 600. The logic 34 can implement one or more aspects of the memory device 150 (FIG. 1B). The apparatus 30 is therefore considered to be performance-enhanced at least to the extent that read operations are performed by using a closed-loop solution that determines when the word line(s) have reached the target voltage, without relying on an open loop solution or a solution that measures a voltage regulator output.

The semiconductor apparatus 30 can be constructed using any appropriate semiconductor manufacturing processes or techniques. For example, the logic 34 can include transistor channel regions that are positioned (e.g., embedded) within the substrate(s) 32. Thus, the interface between the logic 34 and the substrate(s) 32 may not be an abrupt junction. The logic 34 can also be considered to include an epitaxial layer that is grown on an initial wafer of the substrate(s) 34.

Embodiments of each of the above systems, devices, components and/or methods, including the memory device 150, the WL sense circuit 160, the WL sense circuit 400, the memory device 500, the process 600, and/or any other system or device components, can be implemented in hardware, software, or any suitable combination thereof. For example, hardware implementations may include configurable logic, fixed-functionality logic, or any combination thereof. Examples of configurable logic include suitably configured PLAs, FPGAs, CPLDs, and general purpose microprocessors. Examples of fixed-functionality logic include suitably configured ASICs, combinational logic circuits, and sequential logic circuits. The configurable or fixed-functionality logic can be implemented with CMOS logic circuits, TTL logic circuits, or other circuits. Alternatively, or additionally, all or portions of the foregoing systems and/or components and/or methods can be implemented in one or more modules as a set of program or logic instructions stored in a machine- or computer-readable storage medium such as RAM, ROM, PROM, firmware, flash memory, etc., to be executed by a processor or computing device.

ADDITIONAL NOTES AND EXAMPLES

Example D1 includes a memory device comprising a memory array including a local word line circuit and a plurality of local word lines coupled to the local word line circuit, a word line (WL) sense circuit coupled to an access node in the local word line circuit, the WL sense circuit to sense a voltage level in the local word line circuit while bypassing a disturbance to operation of the local word lines and to provide an output signal that indicates when the voltage level has reached a high voltage threshold value to enable a read operation, and read logic coupled to the WL sense circuit, the read logic to receive the output signal from the WL sense circuit, and trigger a read operation for one or more cells in the memory array when the output signal indicates that the voltage level has reached the high voltage threshold value.

Example D2 includes the memory device of Example D1, wherein the WL sense circuit includes a comparator to compare the voltage level with the high voltage threshold, and wherein the high voltage threshold is set based on a low voltage reference.

Example D3 includes the memory device of Example D1 or D2, wherein the low voltage reference is tuned to provide a high voltage threshold optimized for read operations.

Example D4 includes the memory device of Example D1, D2 or D3, wherein the WL sense circuit includes a first transistor having a gate that is coupled to the access node in the local word line circuit, wherein the gate of the first transistor is to draw a level of current from the local word line circuit which is less than a value that disturbs operation of the local word lines.

Example D5 includes the memory device of any of Examples D1-D4, wherein the WL sense circuit further includes a second transistor, and wherein the first transistor and the second transistor form an imbalanced pair coupled to a high voltage input.

Example D6 includes the memory device of any of Examples D1-D5, wherein the memory array includes a plurality of planes, wherein each plane includes a local word line circuit, and wherein for each plane one of a plurality of WL sense circuits is coupled to an access node in the respective local word line circuit.

Example D7 includes the memory device of any of Examples D1-D6, further comprising a switch coupled to the WL sense circuit and to a plurality of access nodes in the local word line circuit, wherein the switch connects an input of the WL sense circuit to one of the plurality of access nodes.

Example D8 includes the memory device of any of Examples D1-D7, further comprising a high voltage input line for an externally supplied high voltage.

Example D9 includes the memory device of any of Examples D1-D8, wherein the externally supplied high voltage is to be in a range of 10 to 12 volts, wherein the low voltage reference is to be in a range of 0.2 to 1.0 volts, and wherein the high voltage threshold is to be in a range of 6 to 7 volts.

Example D10 includes the memory device of any of Examples D1-D9, wherein the read logic is to bypass use of an open loop timer signal for triggering the read operation.

Example A1 includes a semiconductor apparatus comprising a substrate, a memory array coupled to the substrate, the memory array including a global word line, a local word line circuit coupled to the global word line, and a plurality of local word lines coupled to the local word line circuit, and a word line (WL) sense circuit coupled to an access node in the local word line circuit, the WL sense circuit to sense a voltage level in the local word line circuit while bypassing a disturbance to operation of the local word lines and to provide an output signal that indicates when the voltage level has reached a high voltage threshold value to enable a read operation.

Example A2 includes the apparatus of Example A1, wherein the WL sense circuit includes a comparator to compare the voltage level with the high voltage threshold, and wherein the high voltage threshold is set based on a low voltage reference.

Example A3 includes the apparatus of Example A1 or A2, wherein the low voltage reference is tuned to provide a high voltage threshold optimized for read operations.

Example A4 includes the apparatus of Example A1, A2 or A3, wherein the WL sense circuit includes a first transistor having a gate that is coupled to the access node in the local word line circuit, wherein the gate of the first transistor is to draw a level of current from the local word line circuit which is less than a value that disturbs operation of the local word lines.

Example A5 includes the apparatus of any of Examples A1-A4, wherein the WL sense circuit further includes a second transistor, and wherein the first transistor and the second transistor form an imbalanced pair coupled to a high voltage input.

Example A6 includes the apparatus of any of Examples A1-A5, wherein the memory array includes a plurality of planes, wherein each plane includes a local word line circuit, and wherein for each plane one of a plurality of WL sense circuits is coupled to an access node in the respective local word line circuit.

Example A7 includes the apparatus of any of Examples A1-A6, further comprising a switch coupled to the WL sense circuit and to a plurality of access nodes in the local word line circuit, wherein the switch connects an input of the WL sense circuit to one of the plurality of access nodes.

Example A8 includes the apparatus of any of Examples A1-A7, further comprising a high voltage input line for an externally supplied high voltage.

Example A9 includes the apparatus of any of Examples A1-A8, wherein the externally supplied high voltage is to be in the range of 10 to 12 volts, wherein the low voltage reference is to be in the range of 0.2 to 1.0 volts, and wherein the high voltage threshold is to be in the range of 6 to 7 volts.

Example A10 includes the apparatus of any of Examples A1-A9, further comprising logic coupled to the substrate, wherein the logic is implemented at least partly in one or more of configurable or fixed-functionality hardware, the logic to receive the output signal from the WL sense circuit, and trigger a read operation for one or more cells in the memory array when the output signal indicates that the voltage level has reached the high voltage threshold value.

Example A11 includes the apparatus of any of Examples A1-A10, wherein the logic is to bypass use of an open loop timer signal for triggering the read operation.

Example S1 includes a computing system comprising a memory controller, a high voltage power supply, and a memory device coupled to the memory controller, the memory device comprising a memory array including a global word line, a local word line circuit coupled to the global word line, and a plurality of local word lines coupled to the local word line circuit, a high voltage input line coupled to the high voltage power supply, a word line (WL) sense circuit coupled to an access node in the local word line circuit, the sense circuit to sense a voltage level in the local word line circuit while bypassing a disturbance to operation of the local word lines and to provide an output signal that indicates when the voltage level has reached a high voltage threshold value to enable a read operation, and read logic coupled to the WL sense circuit, the read logic to receive the output signal from the WL sense circuit, and trigger a read operation for one or more cells in the memory array when the output signal indicates that the voltage level has reached the high voltage threshold value.

Example S2 includes the computing system of Example S1, wherein the WL sense circuit includes a comparator to compare the voltage level with the high voltage threshold, and wherein the high voltage threshold is set based on a low voltage reference.

Example S3 includes the computing system of Example S1 or S2, wherein the low voltage reference is tuned to provide a high voltage threshold optimized for read operations.

Example S4 includes the computing system of Example S1, S2 or S3, wherein the WL sense circuit includes a first transistor having a gate that is coupled to the access node in the local word line circuit, wherein the gate of the first transistor is to draw a level of current from the local word line circuit which is less than a value that disturbs operation of the local word lines.

Example S5 includes the computing system of any of Examples S1-S4, wherein the WL sense circuit further includes a second transistor, and wherein the first transistor and the second transistor form an imbalanced pair coupled to the high voltage input line.

Example S6 includes the computing system of any of Examples S1-S5, wherein the memory array includes a plurality of planes, wherein each plane includes a local word line circuit, and wherein for each plane one of a plurality of WL sense circuits is coupled to an access node in the respective local word line circuit.

Example S7 includes the computing system of any of Examples S1-S6, further comprising a switch coupled to the WL sense circuit and to a plurality of access nodes in the local word line circuit, wherein the switch connects an input of the WL sense circuit to one of the plurality of access nodes.

Example S8 includes the computing system of any of Examples S1-S7, wherein the high voltage power supply is to provide a high voltage in the range of 10 to 12 volts, wherein the low voltage reference is to be in the range of 0.2 to 1.0 volts, and wherein the high voltage threshold is to be in the range of 6 to 7 volts.

Example S9 includes the computing system of any of Examples S1-S8, wherein the read logic is to bypass use of an open loop timer signal for triggering the read operation.

Example M1 includes a method comprising receiving an output signal from a word line (WL) sense circuit, the WL sense circuit coupled to an access node in a local word line circuit in a memory array, the sense circuit to sense a voltage level in the local word line circuit while bypassing a disturbance to operation of the local word lines, and triggering a read operation for one or more cells in the memory array when the output signal indicates that the voltage level has reached a high voltage threshold value to enable a read operation.

Example M2 includes the method of Example M1, further comprising bypassing use of an open loop timer signal for triggering the read operation.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections, including logical connections via intermediate components (e.g., device A may be coupled to device C via device B). In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A, B, C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A memory device comprising:

a memory array including a local word line circuit and a plurality of local word lines coupled to the local word line circuit;

a word line (WL) sense circuit coupled to an access node in the local word line circuit, the WL sense circuit to sense a voltage level in the local word line circuit while bypassing a disturbance to operation of the local word lines and to provide an output signal that indicates when the voltage level has reached a high voltage threshold to enable a read operation; and read logic coupled to the WL sense circuit, the read logic to:

receive the output signal from the WL sense circuit; and trigger the read operation for one or more cells in the memory array when the output signal indicates that the voltage level has reached the high voltage threshold;

wherein the WL sense circuit includes a first transistor having a gate that is coupled to the access node in the local word line circuit, wherein the gate of the first transistor is to draw a level of current from the local word line circuit which is less than a value that disturbs operation of the local word lines.

2. The memory device of claim 1, wherein the WL sense circuit includes a comparator to compare the voltage level with the high voltage threshold, and wherein the high voltage threshold is set based on a low voltage reference.

3. The memory device of claim 2, wherein the low voltage reference is tuned to provide the high voltage threshold optimized for read operations.

4. The memory device of claim 2, further comprising a high voltage input line for an externally supplied high voltage.

5. The memory device of claim 4, wherein the externally supplied high voltage is to be in a range of 10 to 12 volts, wherein the low voltage reference is to be in a range of 0.2 to 1.0 volts, and wherein the high voltage threshold is to be in a range of 6 to 7 volts.

6. The memory device of claim 1, wherein the WL sense circuit further includes a second transistor, and wherein the first transistor and the second transistor form an imbalanced pair coupled to a high voltage input.

7. The memory device of claim 1, wherein the memory array includes a plurality of planes, wherein each plane includes a respective word line circuit, and wherein for each plane one of a plurality of WL sense circuits is coupled to a respective access node in the respective word line circuit.

8. The memory device of claim 1, further comprising a switch coupled to the WL sense circuit and to a plurality of access nodes in the local word line circuit, wherein the switch connects an input of the WL sense circuit to one of the plurality of access nodes.

9. The memory device of claim 1, wherein the read logic is to bypass use of an open loop timer signal for triggering the read operation.

10. An apparatus comprising:

a substrate;

a memory array coupled to the substrate, the memory array including a global word line, a local word line circuit coupled to the global word line, and a plurality of local word lines coupled to the local word line circuit; and a word line (WL) sense circuit coupled to an access node in the local word line circuit, the WL sense circuit to sense a voltage level in the local word line circuit while bypassing a disturbance to operation of the local word lines and to provide an output signal that indicates when the voltage level has reached a high voltage threshold to enable a read operation:

wherein the WL sense circuit includes a first transistor having a gate that is coupled to the access node in the local word line circuit, wherein the gate of the first transistor is to draw a level of current from the local word line circuit which is less than a value that disturbs operation of the local word lines.

11. The apparatus of claim 10, wherein the WL sense circuit includes a comparator to compare the voltage level with the high voltage threshold, wherein the high voltage threshold is set based on a low voltage reference, and wherein the low voltage reference is tuned to provide the high voltage threshold optimized for read operations.

12. The apparatus of claim 10, wherein the WL sense circuit further includes a second transistor, and wherein the first transistor and the second transistor form an imbalanced pair coupled to a high voltage input.

13. The apparatus of claim 10, wherein the memory array includes a plurality of planes, wherein each plane includes a respective word line circuit, and wherein for each plane one of a plurality of WL sense circuits is coupled to a respective access node in the respective word line circuit.

14. The apparatus of claim 10, further comprising logic coupled to the substrate, wherein the logic is implemented at least partly in one or more of configurable or fixed-functionality hardware, the logic to:

receive the output signal from the WL sense circuit; and trigger the read operation for one or more cells in the memory array when the output signal indicates that the voltage level has reached the high voltage threshold, wherein the logic is to bypass use of an open loop timer signal for triggering the read operation.

15. A computing system comprising:

a memory controller;

a high voltage power supply; and a memory device coupled to the memory controller, the memory device comprising:

a memory array including a global word line, a local word line circuit coupled to the global word line, and a plurality of local word lines coupled to the local word line circuit;

a high voltage input line coupled to the high voltage power supply;

a word line (WL) sense circuit coupled to an access node in the local word line circuit, the WL sense circuit to sense a voltage level in the local word line circuit while bypassing a disturbance to operation of the local word lines and to provide an output signal that indicates when the voltage level has reached a high voltage threshold value to enable a read operation; and read logic coupled to the WL sense circuit, the read logic to:

receive the output signal from the WL sense circuit; and trigger the read operation for one or more cells in the memory array when the output signal indicates that the voltage level has reached the high voltage threshold;

wherein the WL sense circuit includes a first transistor having a gate that is coupled to the access node in the local word line circuit, wherein the gate of the first transistor is to draw a level of current from the local word line circuit which is less than a value that disturbs operation of the local word lines.

16. The computing system of claim 15, wherein the WL sense circuit includes a comparator to compare the voltage level with the high voltage threshold, wherein the high voltage threshold is set based on a low voltage reference, and wherein the low voltage reference is tuned to provide the high voltage threshold optimized for read operations.

17. The computing system of claim 15, wherein the memory array includes a plurality of planes, wherein each plane includes a respective word line circuit, and wherein for each plane one of a plurality of WL sense circuits is coupled to a respective access node in the respective word line circuit.

18. The computing system of claim 15, wherein the WL sense circuit further includes a second transistor, and wherein the first transistor and the second transistor form an imbalanced pair coupled to the high voltage input line.

19. The computing system of claim 15, wherein the read logic is to bypass use of an open loop timer signal for triggering the read operation.

* * * * *